(12) United States Patent
Ferris et al.

(10) Patent No.: US 8,358,145 B1
(45) Date of Patent: Jan. 22, 2013

(54) SELF-HEATING INTEGRATED CIRCUIT

(75) Inventors: Timothy A. Ferris, Mission Viejo, CA (US); John R. Agness, Laguna Hills, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 415 days.

(21) Appl. No.: 12/488,484

(22) Filed: Jun. 19, 2009

(51) Int. Cl.
*G01R 31/00* (2006.01)

(52) U.S. Cl. ........... 324/750.03; 324/750.06; 324/750.3; 324/762.02; 360/75

(58) Field of Classification Search ............. 324/750.03, 324/750.3, 750.06, 762.02; 360/75
See application file for complete search history.

(56) References Cited

U.S. PATENT DOCUMENTS

| | | | |
|---|---|---|---|
| 4,497,998 A | | 2/1985 | West |
| 5,309,090 A | * | 5/1994 | Lipp ........................ 324/750.03 |
| 5,406,212 A | | 4/1995 | Hashinaga et al. |
| 5,416,757 A | | 5/1995 | Luecke et al. |
| 5,498,971 A | | 3/1996 | Turnbull et al. |
| 5,644,556 A | | 7/1997 | Oikawa |
| 5,774,313 A | | 6/1998 | Tanaka et al. |
| 5,889,629 A | * | 3/1999 | Patton, III ....................... 360/75 |
| 5,982,189 A | | 11/1999 | Motika et al. |
| 6,023,145 A | | 2/2000 | Karaaslan et al. |
| 6,046,433 A | | 4/2000 | Gross et al. |
| 6,054,825 A | * | 4/2000 | Hayner .......................... 318/459 |
| 6,229,304 B1 | | 5/2001 | Guzik |
| 6,329,642 B1 | * | 12/2001 | Kaneko et al. ................ 219/497 |
| 6,407,567 B1 | | 6/2002 | Etter |
| 6,483,300 B1 | | 11/2002 | Severson et al. |
| 6,563,294 B2 | * | 5/2003 | Duffy et al. .................... 323/283 |
| 6,819,637 B1 | | 11/2004 | Hasegawa et al. |
| 6,972,539 B1 | * | 12/2005 | Codilian et al. .............. 318/560 |
| 6,977,789 B1 | | 12/2005 | Cloke |
| 6,992,851 B1 | | 1/2006 | Cloke |
| 6,992,852 B1 | | 1/2006 | Ying et al. |
| 7,091,737 B2 | | 8/2006 | Norris |
| 7,103,495 B2 | | 9/2006 | Kiryu |
| 7,145,744 B1 | | 12/2006 | Clawson et al. |
| 7,161,368 B2 | | 1/2007 | Huber et al. |
| 7,199,956 B1 | | 4/2007 | Moser et al. |
| 7,203,021 B1 | * | 4/2007 | Ryan et al. ...................... 360/75 |
| 7,253,985 B1 | | 8/2007 | Gami et al. |
| 7,279,703 B2 | | 10/2007 | Norris et al. |
| 7,321,479 B2 | | 1/2008 | Kim et al. |
| 7,330,327 B1 | | 2/2008 | Chue et al. |
| 7,443,184 B2 | | 10/2008 | Norris |
| 7,630,162 B2 | | 12/2009 | Zhao et al. |
| 7,940,487 B1 | | 5/2011 | Krishnan et al. |
| 2003/0071593 A1 | * | 4/2003 | Pedrazzini et al. ........... 318/567 |
| 2006/0103967 A1 | | 5/2006 | Kim et al. |
| 2007/0030019 A1 | * | 2/2007 | Kinsley ......................... 324/760 |
| 2007/0058280 A1 | * | 3/2007 | Wada et al. ..................... 360/75 |

(Continued)

OTHER PUBLICATIONS

U.S. Appl. No. 12/145,457, Puspanathan, Jun. 24, 2008.

(Continued)

*Primary Examiner* — Arleen M Vazquez

(57) ABSTRACT

Self-heating integrated circuits are provided. In one embodiment, a self-heating integrated circuit comprises a drive circuit configured to drive a device and a controller configured to selectively operate the drive circuit in a first mode or a second mode. In the first mode, the controller is configured to operate the drive circuit to drive the device and, in the second mode, the controller is configured to operate the drive circuit to heat the integrated circuit to a target temperature.

10 Claims, 8 Drawing Sheets

U.S. PATENT DOCUMENTS

2007/0223131 A1 9/2007 Sado et al.
2007/0291401 A1 12/2007 Sun et al.
2008/0157798 A1* 7/2008 Greenberg et al. ........... 324/760
2010/0027156 A1* 2/2010 Izumi .............................. 360/75

OTHER PUBLICATIONS

US 7,391,228, 06/2008, Greenberg et al. (withdrawn)

* cited by examiner

SELF-HEATING INTEGRATED CIRCUIT

BACKGROUND OF THE INVENTION

When a new integrated circuit is received from a supplier, the integrated circuit may be tested over a range of temperatures to verify that the integrated circuit operates properly across the range of temperatures. The range of temperatures during testing may be from room ambient temperature to elevated temperatures (e.g., 125° C.).

The integrated circuit is tested at different temperatures by heating the integrated circuit. In one approach, the integrated circuit and test probes for testing the integrated circuit are placed inside a thermal chamber and the thermal chamber is heated to a target temperature. The integrated circuit is allowed to soak inside the thermal chamber for about 30 minutes to ensure that the integrated circuit reaches the target temperature. In many cases, the integrated circuit is a few degrees off the chamber temperature, which makes it difficult to accurately control temperature of the integrated circuit during testing. Also, the elevated temperatures in the thermal chamber may damage the test probes used for testing the integrated circuit.

BRIEF DESCRIPTION OF THE DRAWINGS

The accompanying drawings, which are included to provide further understanding of the invention and are incorporated in and constitute a part of this specification, illustrate embodiments of the invention and together with the description serve to explain the principles of the invention. In the drawings.

DETAILED DESCRIPTION OF THE INVENTION

In the following detailed description, numerous specific details are set forth to provide a full understanding of the present invention. It will be apparent, however, to one ordinarily skilled in the art that the present invention may be practiced without some of these specific details. In other instances, well-known structures and techniques have not been shown in detail to avoid unnecessarily obscuring the present invention.

Figure 1:
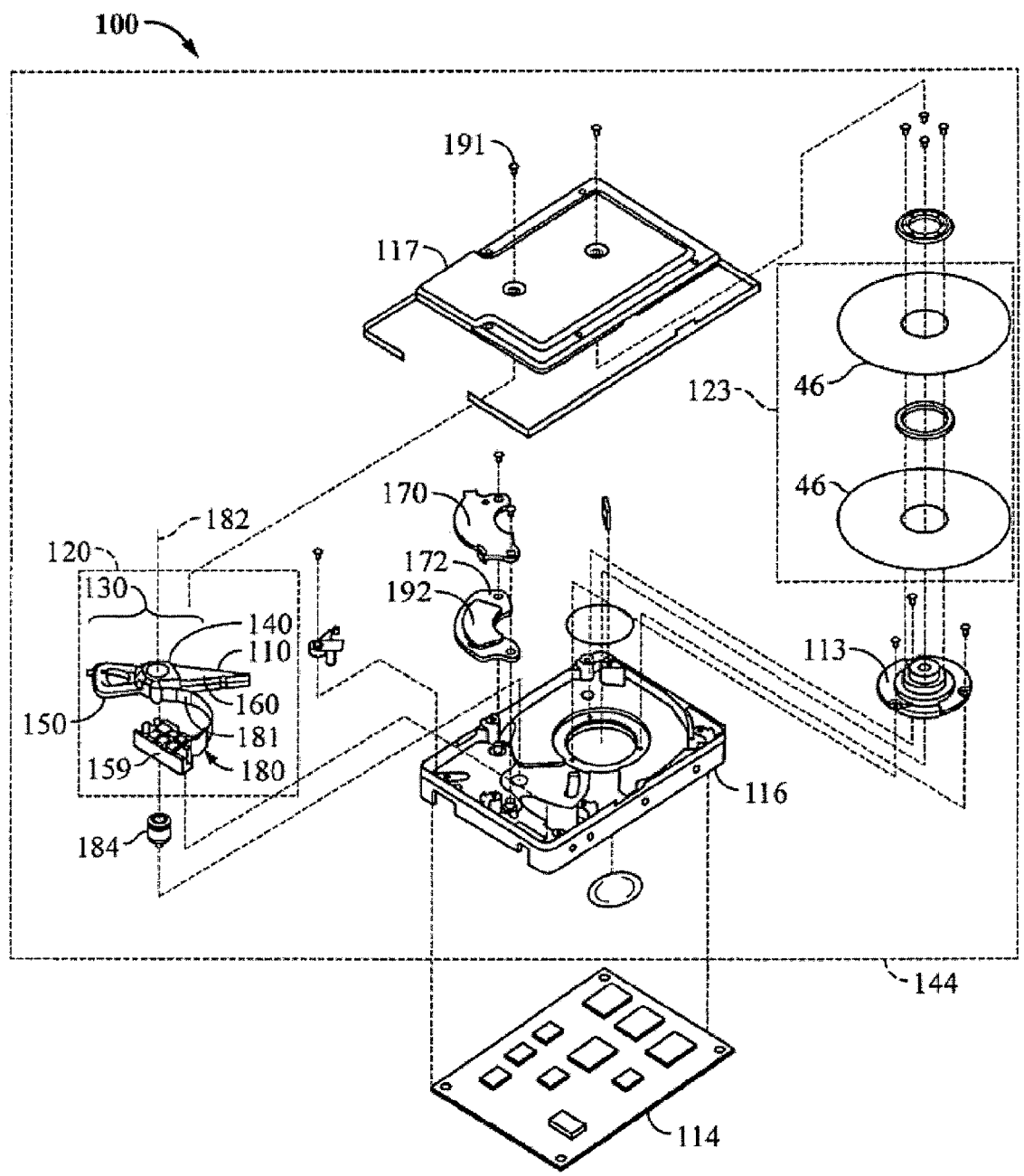
FIG. 1 is a perspective, exploded view of an example of a disk drive.
Figure 2:
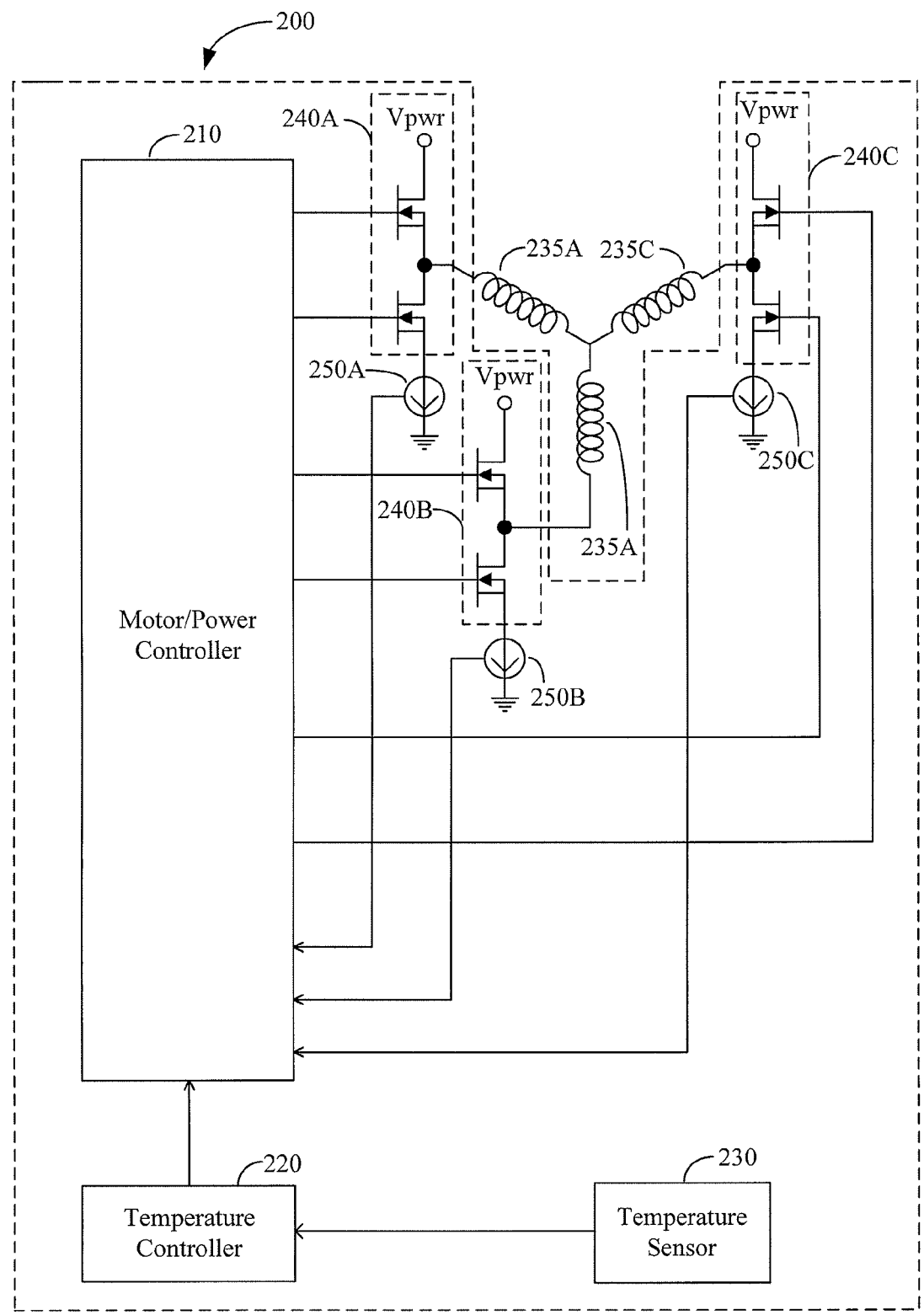
FIG. 2 is a block diagram illustrating a self-heating integrated circuit according to an embodiment of the present invention.

FIG. 1 is a perspective view illustrating the principal mechanical components of an example of a disk drive 100 that may be utilized with embodiments of the invention. The disk drive 100 comprises a head disk assembly (HDA) 144 and a printed circuit board assembly (PCBA) 114. The HDA 144 includes a disk drive enclosure comprising a base 116 and a cover 117 attached to the base 116 that collectively house a disk stack 123 that includes one or a plurality of magnetic disks (e.g. disks 46), a spindle motor 113 attached to the base 116 for rotating the disk stack 123, a head stack assembly (HSA) 120, and a pivot bearing cartridge 184 that rotatably supports the HSA 120 on the base 116. The spindle motor 113 typically rotates the disk stack 123 at a relatively constant angular velocity. In one embodiment, spindle motor 113 may be a three-phase motor comprising three separate coil windings, an example of which is shown in FIG. 2 discussed below.

The HSA 120 comprises a swing-type or rotary actuator assembly 130, at least one head gimbal assembly (HGA) 110, and a flex circuit cable assembly 180. The rotary actuator assembly 130 includes a body portion 140, at least one actuator arm 160 cantilevered from the body portion 140, and a VCM coil 150 cantilevered from the body portion 140 in an opposite direction from the actuator arm 160. The actuator arm 160 supports the HGA 110 that, in turn, supports the head(s). The flex cable assembly 180 may include a flex circuit cable and a flex clamp 159. Further, flex cable assembly 180 may include a temperature sensor 181 mounted to or within the flex circuit cable. Alternatively, a temperature sensor may be mounted on the PCBA 114 facing the HDA 144 surface.

The HSA 120 is pivotally secured to the base 116 via the pivot-bearing cartridge 184 so that the head at the distal end of the HGA 110 may be moved over the surfaces of the disks 46. The pivot-bearing cartridge 184 enables the HSA 120 to pivot about a pivot axis, shown in FIG. 1 at reference numeral 182. The storage capacity of the HDA 144 may be increased by, for example, increasing the track density (the TPI) on the disks 46 and/or by including additional disks 46 in the disk stack 123 and by an HSA 120 having a vertical stack of HGAs 110 supported by multiple actuator arms 160.

The "rotary" or "swing-type" actuator assembly comprises body portion 140 that rotates on the pivot bearing 184 cartridge between limited positions, VCM coil 150 that extends from body portion 140 to interact with one or more permanent magnets 192 mounted to back irons 170, 172 to form the voice coil motor (VCM), and actuator arm 160 that supports HGA 110. The VCM causes the HSA 120 to pivot about the actuator pivot axis 182 to cause the read/write heads or transducers thereof to sweep radially over the disk(s) 46.

FIG. 2 is a block diagram illustrating a self-heating integrated circuit 200, which may be mounted on the PCBA 114. The integrated circuit 200 comprises a motor/power controller 210, a temperature controller 220 and a temperature sensor 230. The temperature sensor 230 is used to measure the temperature of the integrated circuit 200, and may be implemented with one or more temperature sensing diodes and/or resistors. The integrated circuit 200 also comprises three drive circuits 240A-240C for driving three coil windings 235A-235C of a three-phase spindle motor 113, respectively. Each drive circuit 240A-240C comprises two transistors arranged in series forming a half-bridge circuit with one of the coil windings 235A-235C coupled between the transistors. The integrated circuit 200 further comprises three current sensors 250A-250C where each current sensor 250A-250B is coupled to one of the drive circuits 240A-240C for measuring current through the drive circuit 240A-240C.

In one embodiment, the motor/power controller 210 operates the drive circuits 240A-240C in one of two selectable modes. In a first mode, the motor/power controller 210 operates the drive circuits 240A-240C to drive the three coil windings 235A-235B of the spindle motor 113 to rotate the disk(s) 46 (shown in FIG. 1). In a second mode, the controller 210 operates the drive circuits 240A-240C to heat the integrated circuit 200 to a target temperature.

In the first mode, the motor/power controller 210 operates the drive circuits 240A-240C to drive alternating currents through the coil windings 235A-235C, in which the phases of the alternating currents are approximately 120 degrees apart from one another. This operation causes the spindle motor 113 to spin the disk(s) 46, allowing read/write heads to access different sectors of the disk(s) 46. The motor/power controller 210 operates each drive circuit 240A-240C by alternating turning on the transistors of the drive circuit 240A-240C so that only one of the transistors is turned on at a time with the other transistor turned off.

In the second mode, the motor/power controller 210 operates one or more of the drive circuits 240A-240C to heat the integrated circuit 200. For each drive circuit 240A-240C used to heat the integrated circuit 200, the motor/power controller 210 turns on both transistors of the drive circuit 240A-240C simultaneously in the linear region of the transistors. This causes current to conduct through both transistors of the drive circuit 240A-240C from the power supply voltage Vpwr to ground and dissipate power as heat, which in turn heats up the integrated circuit 200. Methods for controlling heating of the integrated circuit 200 to reach a target temperature are discussed below with reference to FIG. 3.

In the second mode, the drive circuits 240A-240C do not have to be connected to the coil windings 235A-235C of the spindle motor 113 since the drive circuits 240A-240C are not being used to drive the spindle motor 113 in this mode. For example, the second mode may be used to self heat the integrated circuit 200 to a target temperature to perform tests on the integrated circuit 200 and PCBA 114 before the drive circuits 240A-240C are connected to the spindle motor 113.

Figure 3:
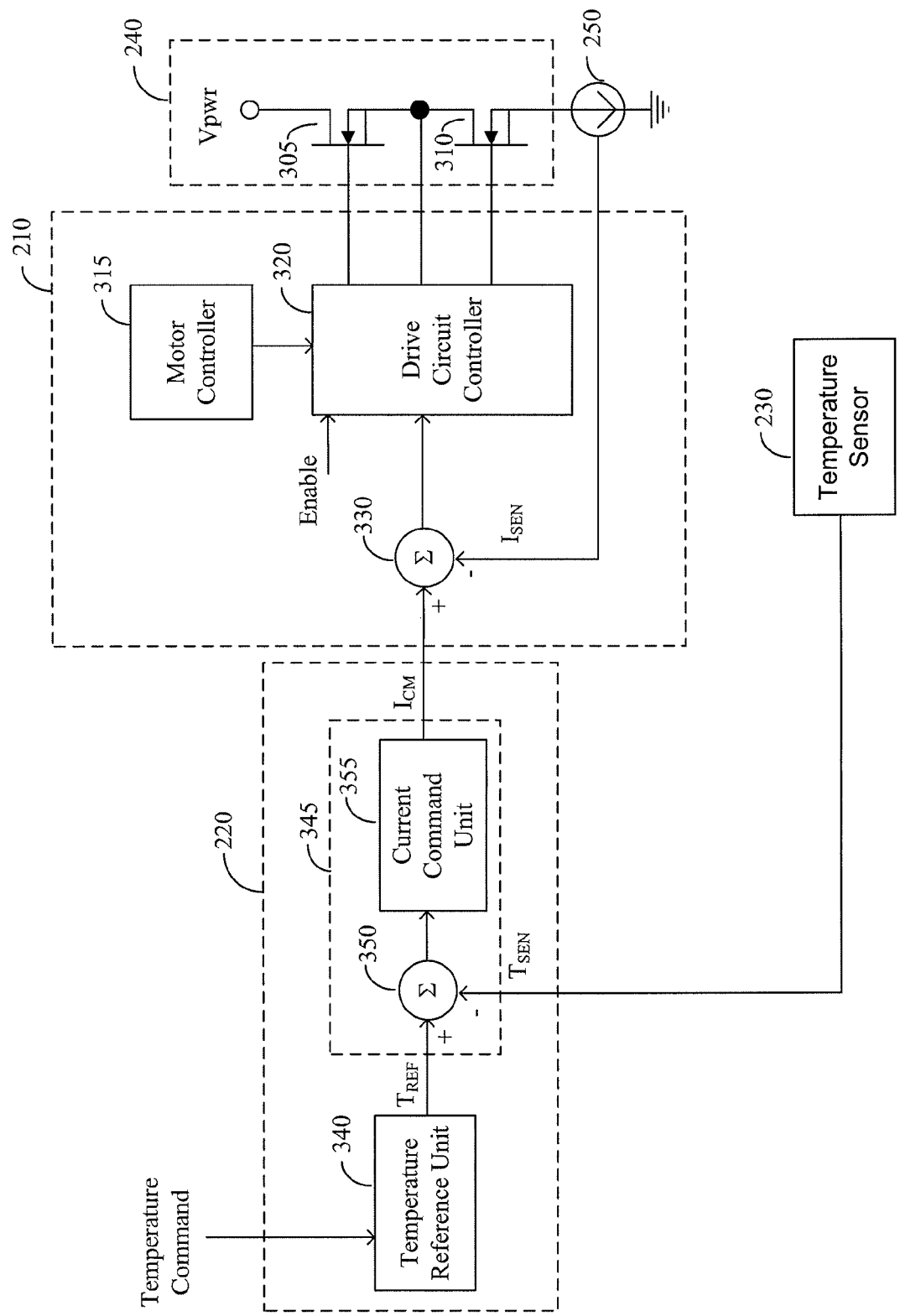
FIG. 3 is a block diagram illustrating a motor/power controller and a temperature feedback loop according to an embodiment of the present invention.

FIG. 3 is a block diagram illustrating the temperature controller 220 and the motor/power controller 210 in more detail. FIG. 3 only shows one drive circuit 240 for ease of illustration. It is to be understood that the following discussion on the control and operation of the drive circuit 240 shown in FIG. 3 may apply to any one or all of the drive circuits 240A-240C shown in FIG. 2.

The temperature controller 220 comprises a temperature reference unit 340 and a temperature compensator 345. The temperature compensator 345 comprises a temperature difference unit 350 and a current command unit 355. The temperature reference unit 340 outputs a reference temperature $T_{REF}$. The reference temperature $T_{REF}$ may be set to a desired target temperature by a temperature command from an external test computer (not shown) coupled in the integrated circuit 200. In one embodiment, the temperature command may comprise a sequence of bits that selects one of a plurality of reference temperatures stored in the temperature reference unit 340. For example, the plurality of reference temperatures may range from 0° C. to 150° C. in 10° C. increments.

The temperature difference unit 350 computes a difference between the reference temperature $T_{REF}$ and a measured temperature $T_{SEN}$ from the temperature sensor 230 and outputs the temperature difference to the current command unit 355. The current command unit 355 generates and outputs a current command $I_{CM}$ based on the temperature difference. The motor/power controller 210 controls the current through the drive circuit 240 in the second mode based on the current command $I_{CM}$.

Thus, the temperature sensor 230 and the temperature controller 220 provide a temperature feedback loop for controlling the current through the drive circuit 240 based on the difference between the target temperature and the measured temperature of the integrated circuit 200. Example embodiments for setting the current command $I_{CM}$ based on the temperature difference are presented below.

The motor/power controller 210 comprises a motor controller 315, a drive circuit controller 320, and current difference unit 330. The current difference unit 330 computes a difference between the current command $I_{CM}$ and a measured current $I_{SEN}$ from the current sensor 250 and outputs the current difference to the drive circuit controller 320. The drive circuit controller 320 operates the drive circuit 240 in one of the two selectable modes. In one embodiment, the drive circuit controller 320 may normally operate in the first mode to drive the spindle motor 113 and operate in the second mode when it receives an enable signal to enable the second mode from a test computer coupled to the integrated circuit 200.

In the first mode, the drive circuit controller 320 operates the drive circuit 240 to drive the spindle motor 113 to rotate the disk(s) 46, as discussed above. In this mode, the motor controller 315 may send commands to the drive circuit controller 320 to drive the spindle motor 113 when the disk(s) 46 needs to be rotated for read/write operations. To drive the spindle motor 113, the drive circuit controller 320 alternately turns on the transistors 305 and 315 so that only one of the transistors 305 and 315 is turned on at a time with the other one of the transistors 305 and 315 turned off.

In the second mode, the drive circuit controller 320 operates the drive circuit 240 by simultaneously turning on both transistors 305 and 310 in the linear region to run a current through both transistors 305 and 315 from the power supply voltage Vpwr to ground. The drive circuit controller 320 controls the current through the transistors 305 and 315 to maintain the current at a current level set by the current command $I_{CM}$. The drive circuit controller 320 may do this by adjusting gate voltages of the transistors 305 and 315 in a direction that minimizes the difference between the current command $I_{CM}$ and the measured current $I_{SEN}$ of the drive circuit 240. Thus, the current sensor 250 and the current difference unit 330 provide a current feedback loop for maintaining the current of the drive circuit 240 at a current level set by current command $I_{CM}$.

In one embodiment, the transistors 305 and 310 of the drive circuit 240 may be implemented with two Field Effect Transistors (FETs) arranged in series forming a half-bridge circuit. In this embodiment, the drive circuit controller 320 may adjust the current through the drive circuit 240 by adjusting the gate voltages of the FETs. If the current difference is positive (i.e., $I_{CM}>I_{SEN}$), then the drive circuit controller 320 adjusts the gate voltages of the FETs to increase the current through the FETs to reduced the current difference. If the current difference is negative (i.e., $I_{SEN}>I_{CM}$), then the drive circuit controller 320 adjusts the gate voltages of the FETs to decrease the current through the FETs to reduced the current difference. Also, the drive circuit controller 320 may be coupled between the FETs, as shown in FIG. 3, to control the voltage between the FETs. For example, the drive circuit controller 320 may maintain the voltage between the FETs at approximately half the power supply voltage Vpwr.

In the second mode, the drive circuit controller 320 may operate one or more of the drive circuits 240A-240C shown in FIG. 2 to heat the integrated circuit 200. For example, two or more of the drive circuits 240A-240C may be used to heat the integrated circuit to distribute heat more evenly across the integrated circuit 200. When two or more drive circuits 240A-240C are used to heat the integrated circuit 200, the motor/power controller 210 may employ a separate current feedback loop for each drive circuits 240A-240C to independently control the current through each drive circuit 240A-240C based on the current command $I_{CM}$. The drive circuit controller 320 may perform the current control described above for each drive circuit 240A-240C using the respective current feedback loop.

Example embodiments for setting the current command $I_{CM}$ outputted by the temperature feedback loop will now be presented. In one embodiment, the temperature compensator 345 may control the current command $I_{CM}$ using proportional control. For example, the current command $I_{CM}$ may be given by:

$$I_{CM} = K \cdot \Delta T \quad (1)$$

where K is a proportionality coefficient and $\Delta T$ is the difference between the reference temperature $T_{REF}$, which is set to the target temperature, and the measured temperature $T_{SEN}$ from the temperature sensor 230. In this embodiment, the current command $I_{CM}$ is proportional to the temperature difference $\Delta T$. The current command $I_{CM}$ is high when the temperature difference $\Delta T$ is large to quickly heat the integrated circuit and is reduced as the temperature of the integrated circuit 200 approaches the target temperature. The proportionality coefficient K may be determined based on a desired power dissipation and heating rate for a given temperature difference $\Delta T$.

In another embodiment, the temperature compensator 345 may control the current command $I_{CM}$ using proportional-integrated-derivative (PID) control. For example, the current command $I_{CM}$ may be given by:

$$I_{CM} = K_1 \cdot \Delta T + K_2 \cdot \int_0^t \Delta T dt + K_3 \cdot \frac{d\Delta T}{dt} \quad (2)$$

where $K_1$ is a proportionality coefficient, $K_2$ is an integral coefficient and $K_3$ is a derivative coefficients of the temperature feedback loop. The coefficients $K_1$, $K_2$ and $K_3$ may be selected to provide stable feedback that causes the measured temperature to quickly reach and settle at approximately the target temperature.

In another embodiment, the current command $I_{CM}$ may be adjusted in a stepwise fashion based on the temperature difference $\Delta T$. In this embodiment, the temperature compensator 345 may store a lookup table in memory comprising a plurality of temperature difference ranges and a current command for each temperature difference range. In this embodiment, the temperature compensator 345 may compute the temperature difference $\Delta T$ between the reference temperature $T_{REF}$ and the measured temperature $T_{SEN}$, determine the corresponding temperature difference range in the lookup table, and use the current command $I_{CM}$ in the lookup table for the corresponding temperature difference range.

In another embodiment, the temperature compensator 345 turns the current command $I_{CM}$ on and off depending on the temperature difference $\Delta T$. For example, the temperature compensator may turn on the current command $I_{CM}$ when the measured temperature $T_{SEN}$ is below the reference $T_{REF}$ to heat the integrated circuit 200, and turn off the current command $I_{CM}$ when the measured temperature $T_{SEN}$ is equal to or greater than the reference temperature $T_{REF}$ to stop heating.

In this example, the current command $I_{CM}$ may be constant when the measured temperature $T_{SEN}$ is below the reference temperature $T_{REF}$ or adjusted stepwise using a lookup table, as discussed above, when the measured temperature $T_{SEN}$ is below the reference temperature $T_{REF}$.

Figure 4:
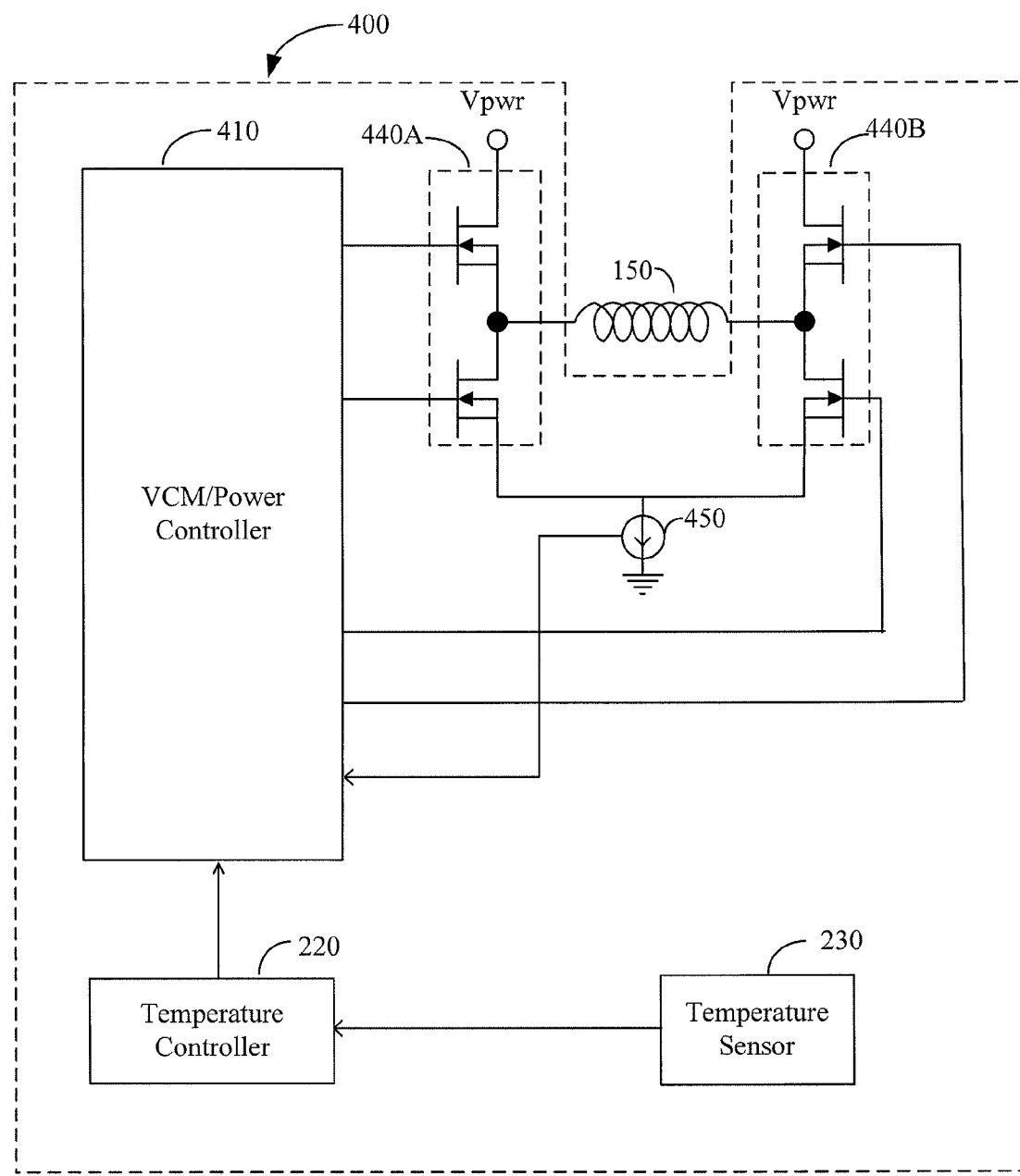
FIG. 4 is a block diagram illustrating a self-heating integrated circuit according to another embodiment of the present invention.

FIG. 4 is a block diagram illustrating a self-heating integrated circuit 400 according to another embodiment. The integrated circuit 400 comprises a VCM/power controller 410, a temperature controller 220 and a temperature sensor 230. The integrated circuit 400 also comprises two circuits 440A and 440B for driving a VCM coil 150. Each drive circuit 440A and 440B comprises two transistors arranged in series forming a half-bridge circuit with one end of the VCM coil 150 coupled between the transistors. The integrated circuit 200 further comprises a current sensor 450 coupled to the drive circuits 440A and 440B for measuring current through the drive circuit 440A and 440B.

In one embodiment, the VCM/power controller 410 operates the drive circuits 440A and 440B in one of two selectable modes. In a first mode, the VCM/power controller 410 operates the drive circuits 440A and 440B to drive the VCM coil 150. In a second mode, the controller 410 operates the drive circuits 440A and 440B to heat the integrated circuit 400 to a target temperature.

In the first mode, the VCM/power controller 410 operates the drive circuits 410A and 410B to drive an alternating current through the VCM coil 150 to generate a magnetic field that interacts with one or more permanent magnets 192 to pivot the actuator arm 160 (shown in FIG. 1). This operation causes the read/write heads mounted on the actuator arm to sweep radially over the disk(s) 46 to access different tracks of the disk(s) (shown in FIG. 1). The motor/power controller 410 operates each drive circuit 440A and 440B by alternating turning on the two transistors of the drive circuit 440A and 440B so that only one of the transistors is turned on at a time with the other transistor turned off.

In the second mode, the VCM/power controller 410 operates one or both of the drive circuits 440A and 440B to heat the integrated circuit 200. For each drive circuit 440A and 440B used to heat the integrated circuit 400, the motor/power controller 410 turns on both transistors of the drive circuit 440A and 440B simultaneously in the linear region of the transistors. This causes current to conduct through both transistors of the drive circuit 440A and 440B from the power supply voltage Vpwr to ground and dissipate power as heat, which heats up the integrated circuit 400.

The VCM/power controller 410 may normally operate in the first mode to drive the VCM coil 150 and operate in the second mode when it receives an enable signal to enable the second mode from an external test computer coupled to the integrated circuit 400. In the second mode, the drive circuits 440A and 440B do not have to be connected VCM coil 150 since the drive circuits 440A and 440B do not drive the VCM coil 150 in this mode.

In the second mode, the VCM/power controller 410 may use the temperature feedback loop provided by the temperature sensor 230 and the temperature controller 220 to control the current though the drive circuits 440A-440B based on the difference between the reference temperature $T_{REF}$ and the measured temperature $T_{SEN}$, as discussed above. The temperature controller 220 may be implemented using the temperature controller 220 illustrated in FIG. 3. Since the operations of the temperature control loop have already been described in detail above with reference to FIG. 3, they are not repeated here.

In the second mode, the VCM/power controller 410 may use a current feedback loop to control the currents through the drive circuits 440A and 440B based on the command current from the temperature controller 220. The current feedback loop may comprise the current sensor 450 and a current difference unit 330 (shown in FIG. 3). In the example shown in FIG. 4, the current sensor 450 measures the combined currents of the drive circuits 440A and 440B. Thus, the current control feedback in this example maintains the combined currents of the drive circuits 440A and 440B at the current level set by the temperature controller 220. In another embodiment, the integrated circuit 600 may include a separate current sensor for each drive circuit 440A and 440B. In this embodiment, the VCM/power controller 410 may control the currents through the drive circuits 440A and 440B using separate current feedback loops. Since the operations of the current feedback loop have already been described in detail above with reference to FIG. 3, they are not repeated here.

Figure 5:
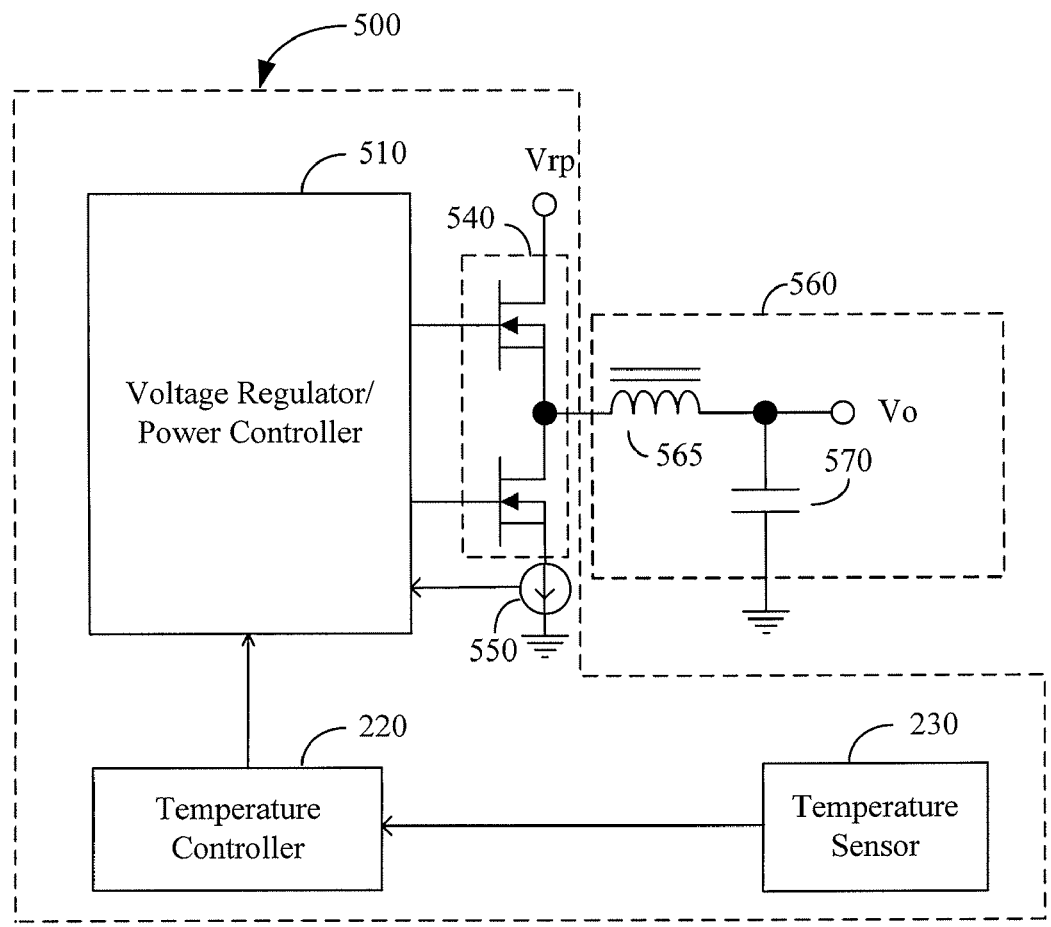
FIG. 5 is a block diagram illustrating a self-heating integrated circuit according to yet another embodiment of the present invention.

FIG. 5 is a block diagram illustrating a self-heating integrated circuit 500 according to another embodiment. The integrated circuit 500 comprises a voltage regulator/power controller 510, a temperature controller 220 and a temperature sensor 230. The integrated circuit 500 also comprises a drive circuit 540 for driving a switched-mode voltage regulator 560 and a current sensor 550 coupled to the drive circuit 540 for measuring current through the drive circuit 540. The voltage regulator 560 comprises an inductor 565 and an output capacitor 570. The voltage regulator 560 may also be incorporated into the integrated circuit 500.

In one embodiment, the voltage regulator/power controller 510 operates the drive circuit 500 in one of two selectable modes. In a first mode, the voltage regulator/power controller 510 operates the drive circuit 540 to drive the voltage regulator 560 to maintain the output voltage $V_O$ at a desired DC voltage. In a second mode, the controller 410 operates the drive circuit 540 to heat the integrated circuit 500 to a target temperature.

In the first mode, the voltage regulator/power controller 510 operates the drive circuit 540 to drive a pulsed current through the inductor 565 to charge the capacitor 570 to the desired DC voltage. The voltage regulator/power controller 510 controls the duty cycle of the pulsed current to maintain the output voltage $V_O$ at the desired DC voltage. The voltage regulator/power controller 510 may adjust the duty cycle of the pulsed current based on feedback from the output voltage $V_O$ of the voltage regulator 560. The voltage regulator 560 may be used to power other circuits (not shown) in the integrated circuit or external circuits at a desired DC voltage. The voltage regulator motor/power controller 510 operates the drive circuit 540 to drive the voltage regulator 560 by alternating turning on the two transistors of the drive circuit 540 so that only one of the transistors is turned on at a time with the other transistor turned off.

In the second mode, the voltage regulator/power controller 510 operates the drive circuit 540 to heat the integrated circuit 400. To do this, the voltage regulator/power controller 510 turns on both transistors of the drive circuit 540 simultaneously in the linear region of the transistors. This causes current to conduct through both transistors of the drive circuit 540 and dissipate power as heat, which heats up the integrated circuit 500.

The voltage regulator/power controller 510 may normally operate in the first mode to drive the voltage regulator 510 and operate in the second mode when it receives an enable signal to enable the second mode from an external test computer coupled to the integrated circuit 500. In the second mode, the drive circuit 540 does not have to be connected to the voltage regulator 560.

In the second mode, the voltage regulator/power controller 510 may use the temperature feedback loop provided by the temperature sensor 230 and the temperature controller 220 to control the current though the drive circuit 540 based on the difference between the reference temperature $T_{REF}$ and the measured temperature $T_{SEN}$, as discussed above. The temperature controller 220 may be implemented using the temperature controller 220 illustrated in FIG. 3. Since the operations of the temperature feedback loop have already been described in detail above with reference to FIG. 3, they are not repeated here.

In the second mode, the voltage regulator/power controller 510 may use a current feedback loop to maintain the current of the drive circuit 540 at the current level set by the temperature controller, as discussed above. The current feedback loop for the drive circuit 540 may comprise the current sensor 550 and a current difference unit 330 (shown in FIG. 3). Since the operations of the current feedback loop have already been described in detail above with reference to FIG. 3, they are not repeated here.

Figure 6:
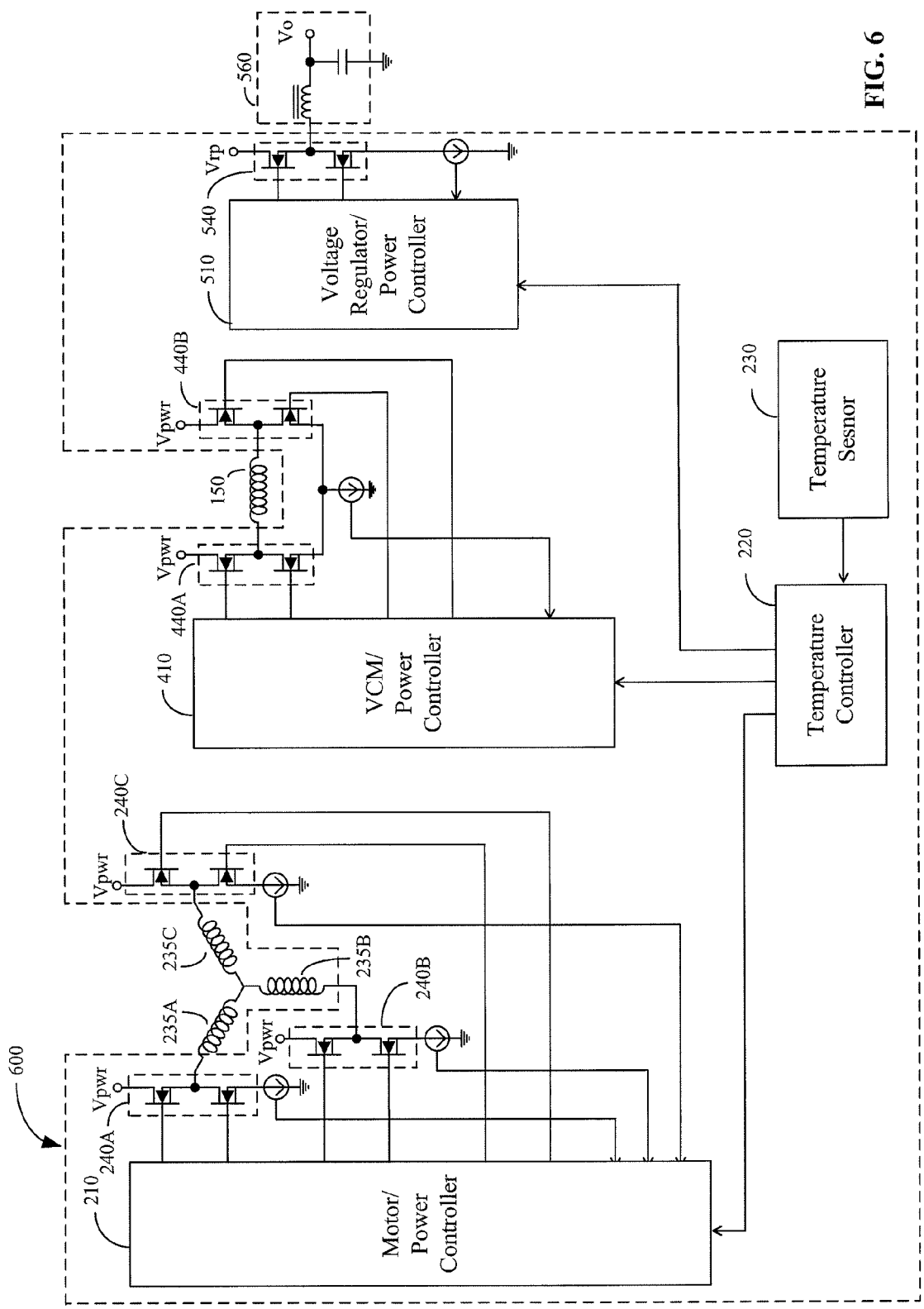
FIG. 6 is a block diagram illustrating a self-heating integrated circuit according to yet another embodiment of the present invention.

FIG. 6 is a block diagram illustrating a self-heating integrated circuit 600 according to another embodiment. The integrated circuit 600 comprises the motor/power controller 210, the VCM/power controller 410, the voltage regulator/power controller 510, the temperature controller 220 and the temperature sensor 230. The integrated circuit 400 also comprises the drive circuits 240A-210C for driving the spindle motor 113, the drive circuits 440A and 440B for driving the VCM coil 150, and the drive circuit 540 for driving the voltage regulator 560.

The motor/power controller 210 operates the drive circuits 240A-240B in two selectable modes. In a first mode, the motor/power controller 210 operates the drive circuits 240A-240C to drive the coil windings 235A-235C of the spindle motor 113 and in a second mode, the motor/power controller 210 operates one or more of the drive circuits 240A-240C to heat the integrated circuit 600, as discussed above. The motor/power controller 210 may normally operate in the first mode to drive the spindle motor 113, and operate in the second mode when the motor/power controller receives an enable signal to enable the second mode from a test computer.

The VCM/power controller 410 operates the drive circuits 440A and 440B in two selectable modes. In a first mode, the VCM/power controller 410 operates the drive circuits 440A and 440B to drive the VCM coil 150 and in a second mode, the VCM/power controller 410 operates one or more of the drive circuits 440A and 440B to heat the integrated circuit 600, as discussed above. The VCM/power controller 410 may normally operate in the first mode to drive the VCM coil 150, and operate in the second mode when the VCM/power controller 450 receives an enable signal to enable the second mode from a test computer.

The voltage regulator/power controller 510 operates the drive circuit 540 in two selectable modes. In a first mode, the voltage regulator/power controller 510 operates the drive circuit 540 to drive the voltage regulator 540 and in a second mode, the voltage regulator/power controller 510 operates the drive circuit 540 to heat the integrated circuit 600. The voltage regulator/power controller 510 may normally operate in the first mode to drive the voltage regulator 565, and operate in the second mode when the voltage regulator/power controller 510 receives an enable signal to enable the second mode from a test computer.

The temperature sensor 230 and the temperature controller 220 form a temperature feedback loop for controlling the currents through the drive circuits 240A-240C, 440A and 440B and 540 based on the difference the reference temperature $T_{REF}$ and the measured temperature $T_{SEN}$. The temperature controller 220 may output a current command to each of the controllers 210, 410 and 510, and each controller 210, 410 and 510 may use the received current command to control the currents of the respective drive circuits 240A-240C, 440A and 440B and 540. The temperature controller 220 may output the same current command to all three controllers 210, 410 and 510 or different current commands based on the difference between the reference temperature $T_{REF}$ and the measured temperature $T_{SEN}$.

The selectable modes of each controller 210, 410 and 510 may be combined in different combinations to provide a plurality of different modes for driving the spindle motor 113, VCM coil 150 and voltage regulator 560, and heating the integrated circuit 600. For example, the motor/power controller 210 may operate the drive circuits 240A-240C to drive the spindle motor 113, while one or both of the other controllers 410 and 510 operate one or more of the other drive circuits 440A-440B and 540 to heat the integrated circuit 600. Also, two or more of the controllers 210, 410 and 510 may simultaneously operate the respective drive circuits 240A-240C, 440A and 440B and 540 to heat the integrated circuit 600. In this embodiment, a test computer may select the controllers 210, 410 and 510 that operate the respective drive circuits 240A-240C, 440A and 440B and 540 to heat the integrated circuit 600 by sending enable signals to the selected controllers 210, 410 and 510.

Therefore, the self-heating integrated circuit according to the various embodiments described above is capable of self heating to different temperatures by setting the target temperature to different temperatures. This allows testing of various components of the integrated circuit at elevated temperatures to verify that the components operate properly across a range of elevated temperatures (e.g., from ambient temperature to 125° C.)

The self-heating integrated circuit according to the various embodiments described above provides advantages over other approaches for heating an integrated circuit. One advantage is that a thermal chamber is not needed to heat the self-heating integrated circuit during testing, which lowers capital equipment costs. The self-heating integrated circuit also reduces setup time by not requiring placement of the self-heating integrated circuit in a thermal chamber. Also, test probes used to test the self-heating integrated circuit do not have to be placed in a thermal chamber. As a result, the test probes are not subjected to elevated temperatures inside a thermal chamber, which can damage the test probes. Another advantage is that the drive circuits dissipate power as heat in the integrated circuit, which reduces heating time. Another advantages is that the temperature feedback loop of the self-heating integrated circuit provides accurate temperature control of the self-heating integrated circuit. Further, the self-heating integrated circuit uses existing drive circuits for heating, and therefore does not require dedicated heating elements, which would increase the size and cost of the integrated circuit.

Figure 7:
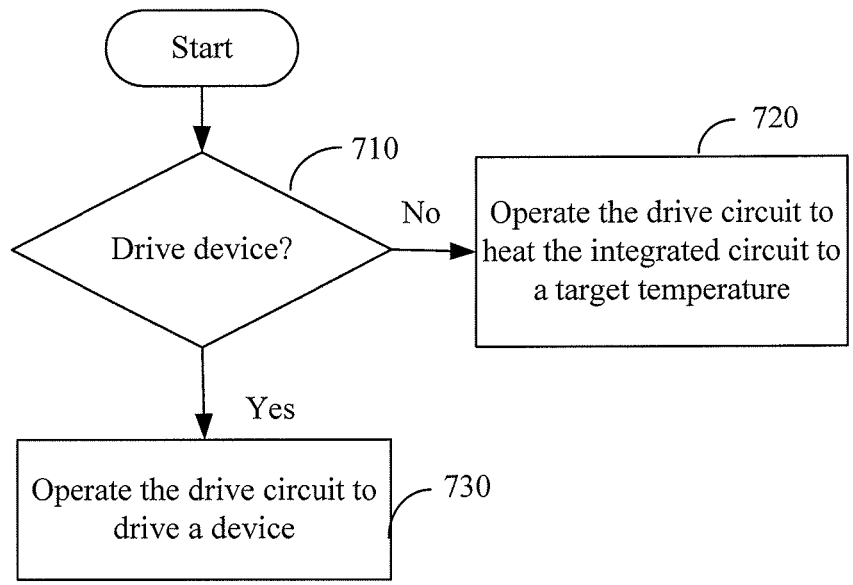
FIG. 7 is a flow diagram illustrating a method for selectively operating a drive circuit in one of two modes according to an embodiment of the present invention.

FIG. 7 is a flow diagram illustrating a method for selectively operating a drive circuit in one of two modes of operation according to an embodiment. The drive circuit may comprise a half-bridge circuit or other circuit. In a first mode, the drive circuit drives a device, for example, a spindle motor, a VCM coil, a voltage regulator or other device. In a second mode, the drive circuit heats an integrated circuit to a target temperature. The method may be performed by a controller, including any of the controllers 210, 410 and 510 described above and/or a combination thereof.

In step 710, the controller determines whether the drive circuit is being used to drive a device. For example, the controller may determine that the drive circuit is not being used to drive a device when the controller receives an enable signal to enable the second mode during testing. If the drive circuit is not being used to drive the device, then the controller operates the drive circuit to heat the integrated circuit to a target temperature in step 720. If the drive circuit is being used to drive the device, then the controller operates the drive circuit to drive the device in step 730.

Figure 8:
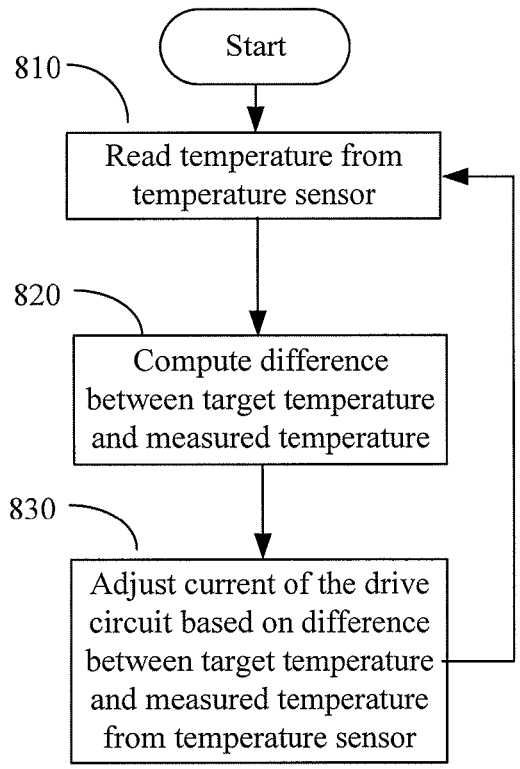
FIG. 8 is a flow diagram illustrating a method for controlling heating of an integrated circuit according to an embodiment of the present invention.

FIG. 8 is a flow diagram illustrating a method for controlling heating of an integrated circuit to a target temperature according to an embodiment.

In step 810, a temperature compensator reads a temperature measurement from a temperature sensor. The temperature sensor may be on the integrated circuit being heated. In step 820, the temperature compensator computes the difference between the target temperature and the measured temperature. In step 830, a controller adjusts the current of the drive circuit used to heat the integrated circuit based on the difference between the target temperature and the measured temperature. The method returns to step 810 after a period of time to readjust the current in response to changes in the measured temperature during the period of time.

Figure 9:
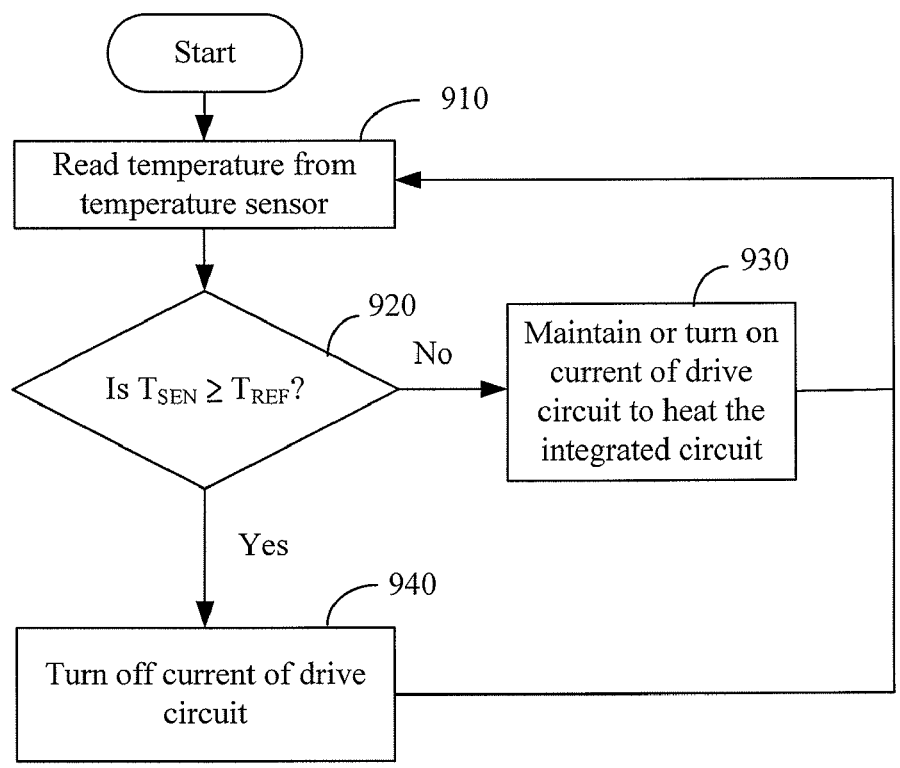
FIG. 9 is a flow diagram illustrating a method for controlling heating of an integrated circuit according to another embodiment of the present invention.

FIG. 9 is a flow diagram illustrating a method for controlling heating of an integrated circuit to a target temperature according to an embodiment.

In step 910, a temperature controller reads a temperature measurement from a temperature sensor. The temperature sensor may be on the integrated circuit being heated. In step 920, the temperature compensator determines whether the measured temperature $T_{SEN}$ is greater than or equal to a reference temperature $T_{REF}$ set at a target temperature. If the measured temperature $T_{SEN}$ is not equal to or greater than the reference temperature $T_{REF}$, then a controller maintains a current of the drive circuit or turns on the current of the drive circuit (if the current was previously turned off) to heat the integrated circuit in step 930. If the measured temperature $T_{SEN}$ is equal to or greater than the reference temperature $T_{REF}$, then the controller turns off the current of the drive circuit to stop heating in step 940. After steps 930 or 940, the method may return to step 910 after a period of time.

The controllers 210, 410 and 510 and the temperature controller 220 may be implemented with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. The controller 210, 410 and 510 may also include software code that is stored in a machine-readable medium and executed by a processor to perform the functions described herein.

The description of the invention is provided to enable any person skilled in the art to practice the various embodiments described herein. While the present invention has been particularly described with reference to the various figures and embodiments, it should be understood that these are for illustration purposes only and should not be taken as limiting the scope of the invention.

There may be many other ways to implement the invention. Various functions and elements described herein may be partitioned differently from those shown without departing from the spirit and scope of the invention. Various modifications to these embodiments will be readily apparent to those skilled in the art, and generic principles defined herein may be applied to other embodiments. Thus, many changes and modifications may be made to the invention, by one having ordinary skill in the art, without departing from the spirit and scope of the invention.

A reference to an element in the singular is not intended to mean "one and only one" unless specifically stated, but rather "one or more." The term "some" refers to one or more. Underlined and/or italicized headings and subheadings are used for convenience only, do not limit the invention, and are not referred to in connection with the interpretation of the description of the invention. All structural and functional equivalents to the elements of the various embodiments of the invention described throughout this disclosure that are known or later come to be known to those of ordinary skill in the art are expressly incorporated herein by reference and intended to be encompassed by the invention. Moreover, nothing disclosed herein is intended to be dedicated to the public regardless of whether such disclosure is explicitly recited in the above description.

What is claimed is:

1. A self-heating integrated circuit (IC), comprising:
    a drive circuit configured to drive a device;
    a multi-mode controller configured to selectively operate the drive circuit in one of a first mode when the device is driven and a second mode when the device is not driven based on a temperature of the IC, wherein, in the first mode, the controller is configured to operate the drive circuit to drive the device and, in the second mode, the controller is configured to operate the drive circuit without driving the device to heat the IC to a target temperature;
    a temperature sensor configured to measure a temperature of the IC;
    a temperature compensator configured to compute a difference between the target temperature and the measured temperature from the temperature sensor,
    wherein, in the second mode, the controller is configured to operate the drive circuit to heat the IC based on the difference between the target temperature and the measured temperature;
    a current sensor configured to measure a current in the drive circuit; and
    a current difference unit configured to compute a difference between a current command and the measured current from the current sensor,
    wherein the temperature compensator is configured to output the current command based on the difference between the target temperature and the measured temperature, and wherein, in the second mode, the controller is configured to adjust the current in the drive circuit based on the difference between the current command and the measured current.

2. The IC of claim 1, wherein the device is a spindle motor, a voice coil motor coil or a voltage regulator.

3. The IC of claim 1, wherein the drive circuit comprises a first transistor and a second transistor in series, and wherein, in the second mode, the controller is configured to operate both the first and second transistors in a linear region to run a current through both the first and second transistors to heat the IC.

4. The IC of claim 1, further comprising:
    a second drive circuit configured to drive a second device, wherein the controller is configured to selectively operate the second drive circuit in a third mode and a fourth mode, wherein in the third mode, the controller is configured to operate the second drive circuit to drive the second device, and, in a fourth mode, the controller is configured to operate the second drive circuit to heat the IC.

5. The IC of claim 4, wherein the controller is configured to selectively operate the first and second drive circuits in a fifth mode, wherein, in the fifth mode, the controller is configured to operate both the first and second drive circuits to heat the IC simultaneously.

6. The IC of claim 1, wherein the drive circuit to drive a device comprises a first bridge circuit configured to drive a spindle motor, the first bridge circuit comprising a first transistor and a second transistor in series.

7. The IC of claim 6, further comprising:
    a second bridge circuit configured to drive a voice coil motor coil, the second bridge circuit comprising a third transistor and a fourth transistor in series, wherein the controller is configured to selectively operate at least one of the first and second bridge circuits to heat the IC to a target temperature.

8. A data storage device comprising:
    media for storing data;
    a self-heating integrated circuit (IC), comprising:
        a drive circuit configured to drive a device;
        a multi-mode controller configured to selectively operate the drive circuit in one of a first mode when the device is driven and a second mode when the device is not driven based on a temperature of the IC, wherein, in the first mode, the controller is configured to operate the drive circuit to drive the device and, in the second mode, the controller is configured to operate the drive circuit without driving the device to heat the IC to a target temperature;
        a temperature sensor configured to measure a temperature of the IC;
        a temperature compensator configured to compute a difference between the target temperature and the measured temperature from the temperature sensor,
        wherein, in the second mode, the controller is configured to operate the drive circuit to heat the IC based on the difference between the target temperature and the measured temperature;
        a current sensor configured to measure a current in the drive circuit; and
        a current difference unit configured to compute a difference between a current command and the measured current from the current sensor,
        wherein the temperature compensator is configured to output the current command based on the difference between the target temperature and the measured temperature, and wherein, in the second mode, the controller is configured to adjust the current in the drive circuit based on the difference between the current command and the measured current.

9. The data storage device of claim 8, wherein the media for storing data comprises a magnetic disk and the device comprises a spindle motor, a voice coil motor coil or a voltage regulator.

10. The data storage device of claim 8, wherein the media for storing data comprises flash memory and the device comprises a voltage regulator.

* * * * *